United States Patent
Sakai

(10) Patent No.: US 6,756,720 B2
(45) Date of Patent: Jun. 29, 2004

(54) LAMINATED PIEZOELECTRIC ACTUATOR

(75) Inventor: Takenobu Sakai, Nishikamo-gun (JP)

(73) Assignee: Toyota Jidoshi Kabushiki Kaisha, Toyota (JP)

( * ) Notice: Subject to any disclaimer, the term of this patent is extended or adjusted under 35 U.S.C. 154(b) by 0 days.

(21) Appl. No.: 10/346,100

(22) Filed: Jan. 17, 2003

(65) Prior Publication Data

US 2003/0141786 A1 Jul. 31, 2003

(30) Foreign Application Priority Data

Jan. 31, 2002 (JP) .................................. 2002-023759
Jan. 10, 2003 (JP) .................................. 2003-004237

(51) Int. Cl.$^7$ ............................................. H01L 41/047
(52) U.S. Cl. ................................ 310/364; 310/363
(58) Field of Search ............................. 310/363, 364

(56) References Cited

U.S. PATENT DOCUMENTS 5,426,340 A * 6/1995 Higaki et al. ............ 310/313 R
6,182,340 B1 * 2/2001 Bishop ........................ 29/25.35
6,236,113 B1 * 5/2001 Zhang et al. ................ 257/757

FOREIGN PATENT DOCUMENTS

JP  U 6-70258  9/1994 ........... H01L/41/09

OTHER PUBLICATIONS

Journal of Ceramic Society of Japan, 109 [9], pp. 827–831, 1999.

* cited by examiner

Primary Examiner—Thomas M. Dougherty
(74) Attorney, Agent, or Firm—Oliff & Berridge, PLC

(57) ABSTRACT

A laminated piezoelectric actuator includes piezoelectric plates, and inner electrode layers composed of an electrode material. The piezoelectric plates and the inner electrode layers are laminated alternately. The electrode material includes a metallic component, and an electrically conductive oxide. When the electrically conductive oxide, in which the oxygen ions works as carriers, is added to the electrode material, oxygen is supplied into the operating piezoelectric plates from the inner electrode layers. As a result, the piezoelectric plates are inhibited from degrading.

12 Claims, 2 Drawing Sheets

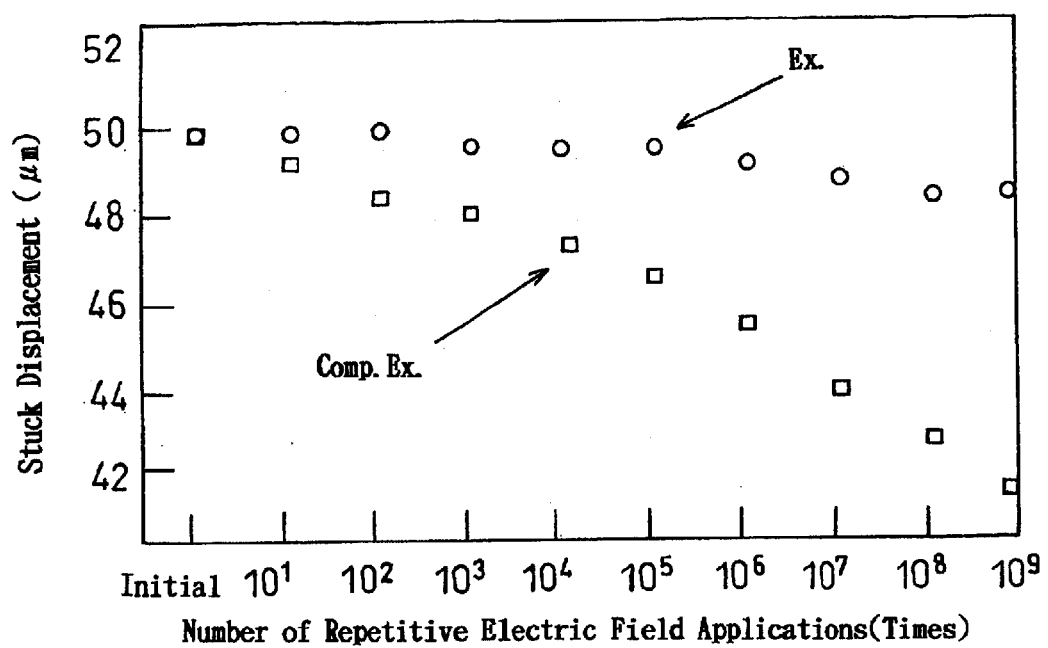

LAMINATED PIEZOELECTRIC ACTUATOR

BACKGROUND OF THE INVENTION

1. Field of the Invention

The present invention relates to a laminated piezoelectric actuator.

2. Description of the Related Art

Conventionally, laminated piezoelectric actuators have been used as actuators for operating movable parts of a variety of instruments such as electronically controlled suspensions. The laminated piezoelectric actuators are displaced by a voltage application. A laminated piezoelectric actuator is integrated in the following manner. A green sheet is formed from a raw material in which a lead zirconate titanate (i.e., PZT) powder is mixed with an organic binder, a plasticizer, an organic solvent, and the like. The PZT powder serves as a piezoelectric material. Then, the surfaces of the green sheet are coated with a conductive paste. The coated green sheets are laminated in a plurality of pieces, and are thereafter calcined at a predetermined temperature. Thus, a laminated piezoelectric actuator is integrated in which piezoelectric plates and inner electrode layers are laminated alternately. When electricity is supplied to the inner electrode layers, the piezoelectric plates are extended in the axial direction to operate as an actuator. Hence, it is possible to expect a highly accurate applied voltage-displacement characteristic.

In actuators in which the displacements are caused by applying strong electric fields, it is important that the piezoelectric characteristics are reliable. In the conventional laminated piezoelectric actuators which are mainly composed of PZT, there is a problem in that, when they are operated by applying electric fields repeatedly after they are subjected to a polarization treatment with an electric field in advance, the piezoelectric characteristics, such as the piezoelectric constants and displacements, have been degraded as the number of electric field applications is increased. It is believed that the disadvantage occurs as follows. The concentration distributions of the constituent elements of the piezoelectric plates which are subjected to the polarization treatment, especially, the localization of the oxygen elements localized on the side of the positive electrode is relieved by applying strong electric fields repeatedly (Journal of the Ceramic Society of Japan 107 [9] pp. 827–831).

SUMMARY OF THE INVENTION

The present invention has been developed in view of such a problem. It is therefore an object of the present invention to provide a laminated piezoelectric actuator whose piezoelectric characteristics are degraded less when it is operated by applying an electric field repeatedly, namely, whose highly accurate applied voltage-displacement characteristic can be maintained.

A laminated piezoelectric actuator according to the present invention comprises: piezoelectric plates; and inner electrode layers composed of an electrode material; the piezoelectric plates and the inner electrode layers laminated alternately; and the electrode material including a metallic component and an electrically conductive oxide. Note that the electrically conductive oxide can naturally be not only simple oxides but also composite oxides. When the electrically conductive oxide, in which the oxygen ions are made into carriers, is added to the electrode material, oxygen is supplied into the operating piezoelectric plates from the inner electrode layers. As a result, the piezoelectric plates are inhibited from degrading.

In the laminated piezoelectric actuator according to the present invention, the electrically conductive oxide, in which the oxygen ions work as carriers, is added to the electrode material of the inner electrode layers. Accordingly, even when strong electric fields are applied to the present laminated piezoelectric actuator repeatedly, the piezoelectric characteristics of the piezoelectric plates, which includes a PZT composite oxide, are inhibited from degrading. Consequently, it is possible to maintain the reliability as a laminated piezoelectric actuator. The advantage results from the fact that it is accompanied by the repetitive operation that the electrically conductive oxide, which is added in the inner electrode layers, supplies oxygen to the inside of the piezoelectric plates. As a result, it is possible to suppress the lowering of the oxygen concentration due to the repetitive operations.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure:

FIG. 3 is a graph for illustrating the variations of the stuck displacements, variation which depended on the number of repetitive electric field applications in a durability test, wherein blank circles "○" specify the stuck displacements exhibited by an example and blank squares "□" specify the stuck displacements exhibited by a comparative example.

DETAILED DESCRIPTION OF THE PREFERRED EMBODIMENTS

Having generally described the present invention, a further understanding can be obtained by reference to the specific preferred embodiments which are provided herein for the purpose of illustration only and not intended to limit the scope of the appended claims.

Figure 1:
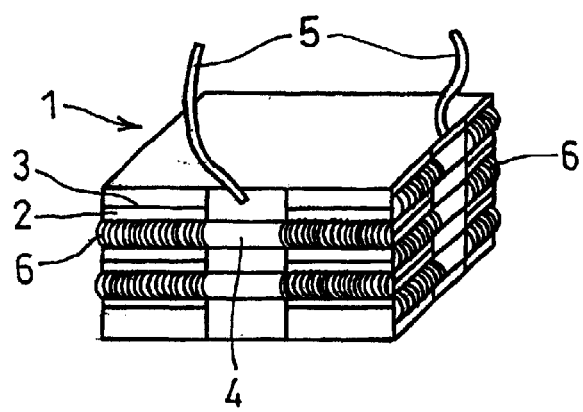
FIG. 1 is a diagram for illustrating an outline of a laminated piezoelectric actuator according to the present invention.

FIG. 1 illustrates an arrangement of the laminated piezoelectric actuator according to the present invention. For example, the present laminated piezoelectric actuator comprises piezoelectric plates 2, inner electrode layers 3, conductor plates 4, lead wires 5, and insulators 6. The thus arranged laminated piezoelectric assembly 1 is subjected to a polarization treatment by applying a high voltage, and is thereby made into the present laminated piezoelectric actuator.

The piezoelectric plates can be obtained by forming green sheets from a raw material by means of a sheet forming process. An organic binder, a plasticizer, an organic solvent, and the like, are appropriately added to and mixed with a PZT powder to prepare the raw material. The PZT powder includes $Pb(Zr, Ti)O_3$ or a solid solution of $PbZrO_3$ and PbTiO$_3$. The dimensions of the green sheets depend on the applications of the present laminated piezoelectric actuator. However, it is appropriate that the thickness of the green sheets can fall in a range of from 20 to 500 μm.

The electrode material of the inner electrode layers includes a metallic component and an electrically conductive oxide. The metallic component can desirably include at least one element selected from the group consisting of Ag, Pd, Pt, Rh, Al, Ni and Cu. The electrically conductive oxide can preferably be at least one member selected from oxides or composite oxides which are likely to release oxide. For example, the electrically conductive oxide can be at least one rutile type crystal structure oxide selected from the group consisting of IrO$_2$, OsO$_2$, RhO$_2$, PtO$_2$, MoO$_2$, WO$_2$, LaO$_2$ and SnO$_2$. Further, the electrically conductive oxide can be at least one perovskite type crystal structure oxide selected from the group consisting of SnO$_2$, (R.E.)O$_2$, M$_x$(R.E.)O$_3$, SrCoO$_3$, La$_{1-x}$Sr$_x$CoO$_3$, SrIrO$_3$ and BaPb$_{1-x}$Bi$_x$O$_3$ wherein "R.E." stands for rare-earth element and "M" is at least one element selected from the group consisting of Mg, Na, K, Al, Cu, Sr, Ti, Ni, Fe, Mn, V and Cr. When the electrically conductive oxide is M$_x$(R.E.)O$_3$, the value "x" can preferably fall in a range of from 1 to 3. When the electrically conductive oxide is La$_{1-x}$Sr$_x$CoO$_3$, the value "x" can preferably fall in a range of from 0 to 0.5. When the electrically conductive oxide is BaPb$_{1-x}$Bi$_x$O$_3$, the value "x" can preferably fall in a range of from 0 to 0.6. Furthermore, the electrically conductive oxide can be at least one K$_2$NiF$_4$ type crystal structure oxide selected from the group consisting of La$_2$NiO$_4$, LaCuO$_4$ and YB$_2$Cu$_3$O$_7$. Moreover, the electrically conductive oxide can be at least one pyrochlore type crystal structure oxide selected from the group consisting of Pb$_2$Ir$_2$O$_{7-x}$, Pb$_2$Ru$_2$O$_{7-x}$, Bi$_2$Ir$_2$O$_7$ and Lu$_2$Ir$_2$O$_7$. When the electrically conductive oxide is Pb$_2$Ir$_2$O$_{7-x}$, the value "x" can preferably fall in a range of from 0 to 1. When the electrically conductive oxide is Pb$_2$Ru$_2$O$_{7-x}$, the value "x" can preferably fall in a range of from 0 to 1.

It is desirable that the electrode material can contain the electrically conductive oxide in an amount of from 1 to 20% by weight with respect to the sum of metallic component and the electrically conductive oxide taken as 100% by weight. When the electrode material contains the electrically conductive oxide in an amount of less than 1% by weight, it is not sufficient to inhibit the piezoelectric characteristics of the resulting actuators from degrading. On the other hand, when the electrode material contains the electrically conductive oxide in an amount of more than 20% by weight, the resistivity of the resulting inner electrode layers rises so that no highly-accurate applied voltage-displacement characteristic can be obtained. Moreover, it is more desirable that the electrode material can contain the electrically conductive oxide in an amount of from 1 to 12% by weight, further preferably from 6 to 12% by weight, furthermore preferably from 6 to 10% by weight, with respect to the sum of the metallic component and the electrically conductive oxide taken as 100% by weight.

The laminated piezoelectric assembly 1 can be formed in the following manner, for example.

First, the metallic component and the electrically conductive oxide are made into a conductive paste. The resulting conductive paste is coated by a screen printing process and the like in a predetermined thickness on one of the opposite surfaces of the green sheets entirely. Subsequently, the green sheets with the conductive paste coated are laminated in a desired number of layers so as to alternately laminate the surface of the green sheets coated with the conductive paste on the opposite surface of the other green sheets free from the conductive paste coating. Then, the plurality of the green sheets thus laminated are subjected to a predetermined load to bond them together, and are dried thereafter. The resulting intermediate assembly is degreased, and is thereafter put into a double sheath which can keep a lead atmosphere. Finally, the double sheath is put in air or an oxygen gas flow, and the intermediate assembly is calcined at a temperature of from 900 to 1,200° C. for a period of from 1 to 5 hours. Thus, the laminated piezoelectric assembly 1 is made in which the inner electrode layers 3 and the piezoelectric plates 2 are alternately laminated to integrate.

The laminated piezoelectric assembly 1 is subjected to an insulation treatment, and is provided with lead wires 5. Thereafter, the laminated piezoelectric assembly 1 is immersed into a silicone oil which has been heated to 100° C. Then, a high voltage is applied between the lead wires 5 to subject the laminated piezoelectric assembly 1 to an electric field of from 1 to 2 kV/mm. Thus, the laminated piezoelectric assembly 1 is subjected to a polarization treatment, and is made into the present laminated piezoelectric actuator.

Note that the insulation treatment can be carried out in the following manner. The inner electrode layers 3 are covered with an insulator 6 every other layer on one of the outwardly exposed side surfaces of the laminated piezoelectric assembly 1. Moreover, the inner electrode layers 3 are further covered with an insulator 6 every other layer, whose neighboring layer is covered with the insulator 6 on the one of the outwardly exposed side surfaces, on another one of the outwardly exposed side surfaces neighboring the one of the outwardly exposed side surfaces.

In addition, the laminated piezoelectric assembly 1 can be provided with the lead wires 5 as follows. Electrically conductive plates 4 are disposed on the respective side surfaces of the laminated piezoelectric assembly 1 covered with the insulators 6 so as to contact with the respective inner electrode layers 3 which are not covered with the insulator 6 but which are exposed to the outside. Then, the lead wires 5 are connected with the electrically conductive plates 4.

Here, since the laminated electrically conductive plates 4 are to be connected with the inner electrode layers 3, it is desirable, for example, to use a silver plate, which is good in terms of electric conduction, for the conductive plates 4. Moreover, the lead wires 5 are not limited in particular as far as they are likewise good in terms of electric conduction. In addition, as for the insulator 6, it is possible to exemplify insulative rubber, for instance.

The process for producing the present laminated piezoelectric actuator described above is an example of the production process. Accordingly, the way how to produce the present laminated piezoelectric actuator is not limited to the above-described process at all.

EXAMPLE

Hereinafter, an example of the laminated piezoelectric actuator according to the present invention will be described specifically.

An example of the piezoelectric actuator according to the present invention will be hereinafter described in detail with reference to FIG. 1. The laminated piezoelectric actuator comprised piezoelectric plates 2, inner electrode layers 3, silver plates 4, lead wires 5, and insulation rubber 6. Namely, the silver plates 4 served as the electrically conductive plates, and the insulation rubber 6 served as the insulators. The piezoelectric plates 2 and the inner electrode layers 3 were laminated alternately. Moreover, the lead wires 5 were connected with the inner electrode layers 3, whose side surfaces were not insulated every other layer, by way of the silver plates 4.

As for the metallic component of the electrode material, Ag was used. Moreover, as for the electrically conductive oxide of the electrode material, $IrO_2$ having a rutile type crystal structure was used. The $IrO_2$ was added to Ag in an amount of 10% by weight with respect to the sum of Ag and $IrO_2$ taken as 100% by weight. The mixture was turned into a paste. The resulting paste was used as the electrode material.

The piezoelectric plates 2 were made by forming green sheets from a raw material by means of a sheet forming process. The raw material was prepared by appropriately adding an organic binder, a plasticizer, an organic solvent, and the like, to and mixing them with a PZT powder. The PZT powder included $Pb(Zr, Ti)O_3$ or a solid solution of $PbZrO_3$ and $PbTiO_3$. The resulting green sheets had a thickness of 0.1 mm, a width of 100 mm, and a length of 200 mm.

Production Process for Actuator

The conductive paste, including the electrode material, was coated by a screen printing process in a predetermined thickness on one of the opposite surfaces of the green sheets entirely. Subsequently, the green sheets with the conductive paste coated were cut to squared pieces whose size was 10 mm×10 mm×0.1 mm. The cut squared pieces were laminated in a quantity of 400 pieces so as to alternately laminate the surface of the green sheets coated with the conductive paste on the opposite surface of the other green sheets free from the conductive paste coating. Then, the laminated green sheets were subjected to a predetermined load to bond them together, and were dried to turn them into an intermediate assembly. Moreover, the intermediate assembly was degreased, and was put into a double sheath which could keep a lead atmosphere. Finally, the intermediate assembly was calcined in air at a temperature of 1,200° C. for 5 hours. Thus, the laminated piezoelectric assembly 1 was made in which the inner electrode layers 3 and the piezoelectric plates 2 were alternately laminated to integrate. Note that the thickness of the inner electrode layers 3 was about 5 $\mu$m after the calcination. Moreover, the laminated piezoelectric assembly 1 had a size of 8 mm×8 mm×34 mm after the calcination.

The laminated piezoelectric assembly 1 was subjected to an insulation treatment, and was provided with lead wires 5. Thereafter, the laminated piezoelectric assembly 1 was immersed into a silicone oil which had been heated to 100° C. Then, a high voltage was applied between the lead wires 5 to subject the laminated piezoelectric assembly 1 to an electric field of 2 kV/mm. Thus, the laminated piezoelectric assembly 1 was subjected to a polarization treatment, and was made into a laminated piezoelectric actuator according to the present invention. Note that the insulation treatment was carried out in the following manner. The inner electrode layers 3 are covered with an insulator 6 every other layer on one of the outwardly exposed side surfaces of the laminated piezoelectric assembly 1. Moreover, the inner electrode layers 3 are further covered with an insulator 6 every other layer, whose neighboring layer is covered with the insulator 6 on the one of the outwardly exposed side surfaces, on another one of the outwardly exposed side surfaces neighboring the one of the outwardly exposed side surfaces. In addition, the laminated piezoelectric assembly 1 was provided with the lead wires 5 as follows. The silver plates 4 were disposed on the respective side surfaces of the laminated piezoelectric assembly 1 covered with the insulation rubber 6 so as to contact with the respective inner electrode layers 3 which were not covered with the insulation rubber 6 but which were exposed to the outside. Then, the lead wires 5 were connected with the silver plates 4.

Method of Durability Test

Regarding the resulting laminated piezoelectric actuator, a durability test was carried out under the following conditions:

Strength of Applied Electric Field: from 0 to 1 kV/mm;
Frequency: 100 Hz;
Load Fluctuation: from 10 to 20 MPa; and
Temperature: 150° C.

Note that a laminated piezoelectric actuator was produced in the same manner as the example but by using an Ag paste, which was free from any electrically conductive oxide, as an electrode material. The resulting laminated piezoelectric actuator was labeled as a comparative example. Regarding the comparative example as well, a durability test was carried out in the same manner as the example.

Method of Assessment

Every time the durability test was carried out for predetermined times, the constituent elements of one of the piezoelectric plates 2 were analyzed quantitatively on the positive electrode side of the piezoelectric plate 2 (or PZT layer). For the quantitative analysis of the elemental concentrations, an electron X-ray probe microanalyzer (EPMA) "JXA-8600" was used which was made by NIHON DENSHI Co., Ltd. The diameter of the beam was set to 10 $\mu$m. The elemental concentrations were measured at arbitrary five points within about 10 $\mu$m from the positive-electrode-side surface of the piezoelectric plate 2, and the average values were determined. Four elements, i.e., lead, zirconium, titanium and oxygen, were measured for the concentrations.

Moreover, the variations of the stuck displacement were measured every time the durability test was carried out for predetermined times. The stuck displacement was measured in the following manner. First, the laminated piezoelectric actuators were installed onto a letter "U"-shaped frame whose rigidity was high, respectively. Then, the laminated piezoelectric actuators were subjected to a preload application of 10 MPa, and were fastened to the frame with jig screws. Subsequently, an electric field whose strength was from 0 to 1 kV/mm was applied to the laminated piezoelectric actuators with a sine wave whose frequency was 5 Hz. Then, the positional fluctuations at the top of the frame were measured with a laser displacement meter or a gap sensor.

Results of Assessment

Figure 2:
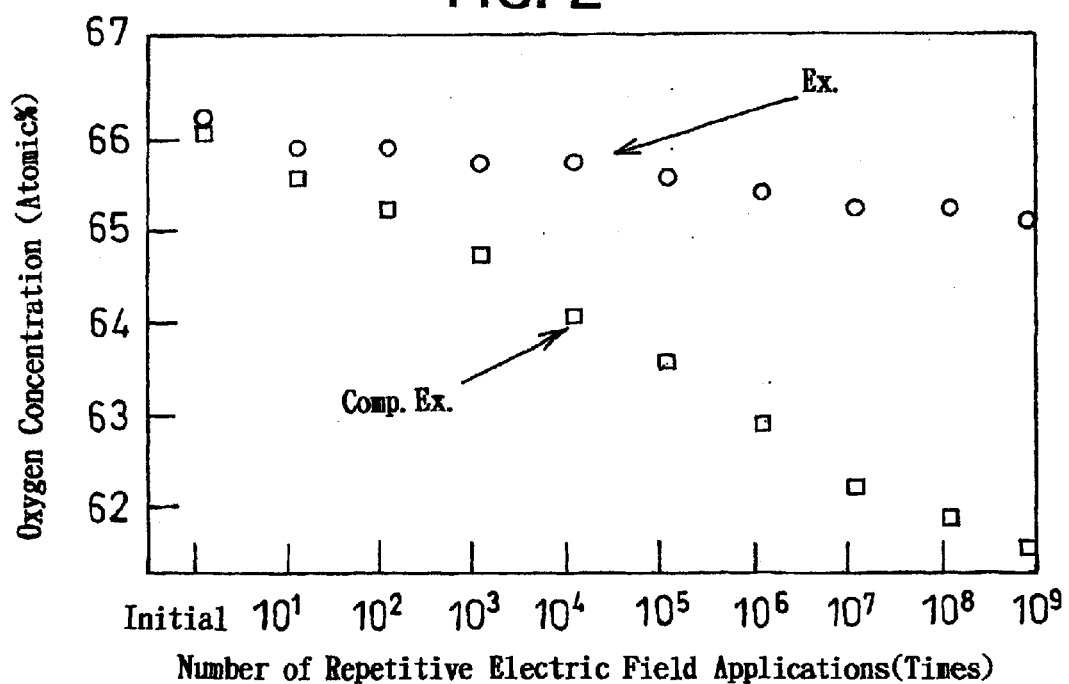
FIG. 2 is a graph for illustrating the variations of the oxygen concentrations adjacent to the positive electrode, variations which depended on the number of repetitive electric field applications in a durability test, wherein blank circles "○" specify the oxygen concentrations exhibited by an example and blank squares "□" specify the oxygen concentrations exhibited by a comparative example.

FIG. 2 illustrates the variations of the oxygen concentration which was the most distinctive among the quantitatively analyzed concentrations of the constituent elements. In the laminated piezoelectric actuator according to the present invention in which the electrode material including 10% by weight with respect to the sum of Ag and $IrO_2$ taken as 100% by weight was used, even when the number of the repetitive electric field applications was increased, the oxygen concentration adjacent to the positive electrode decreased less. On the other hand, in the laminated piezoelectric actuator of the comparative example in which the electrode material composed of the Ag paste alone, the oxygen concentration adjacent to the positive electrode decreased sharply as the number of the repetitive electric field applications was increased. This represents that, in the present laminated piezoelectric actuator, it is possible to suppress the lowering of the oxygen concentration, resulting from the repetitive operations, by supplying oxygen from the $IrO_2$, which is added in the inner electrode layers 3, with respect to the movement of oxygen from the vicinity of the positive electrode to the vicinity of the negative electrode, movement which is accompanied by the repetitive operations.

Moreover, FIG. 3 illustrates the variations of the stuck displacement which were accompanied by operating the laminated piezoelectric actuators repeatedly. From the drawing, it is understood that, in the laminated piezoelectric actuator according to the present invention in which the electrode material including 10% by weight with respect to the sum of Ag and $IrO_2$ taken as 100% by weight was used, even when the number of the repetitive electric field applications was increased, the stuck displacement decreased extremely less. On the other hand, it is understood that, in the laminated piezoelectric actuator of the comparative example in which the electrode material composed of the Ag paste alone, the stuck displacement decreased sharply as the number of the repetitive electric field applications was increased so that the degradation rate of the displacement was larger than that of the present laminated piezoelectric actuator. Specifically, when the number of the repetitive electric field applications was $10^9$ times, the degradation rate of the displacement was 2% in the present laminated piezoelectric actuator, but was 16% in the comparative laminated piezoelectric actuator concerning the prior art. Here, the degradation rate of the displacement refers to the decrement rate of the stuck displacement with respect to the initial stuck displacement after the electric field was applied to them repeatedly $10^9$ times. Namely, in the present example, since the oxygen concentration adjacent to the positive electrode was maintained as illustrated in FIG. 2 even when the number of the repetitive electric field applications was increased, the initial polarized state in the piezoelectric plates 2 was maintained. As a result, the degradation rate of the displacement decreased.

Experimental Example No. 1

The process for producing the laminated piezoelectric actuator of the example was followed to produce piezoelectric devices in which the $IrO_2$ was added to the electrode material, which was composed of Ag mainly, while the content of the $IrO_2$ was varied in a range of from 0 to 30% by weight with respect to the sum of Ag and $IrO_2$ taken as 100% by weight. The piezoelectric devices were produced by laminating 400 pieces of the green sheets, and bonding and calcining them together with the resultant electrode materials in the same manner as the example, and had dimensions of 8 mm×8 mm×34 mm similarly. The resulting-piezoelectric devices were subjected to the repetitive electric field applications under the same conditions as those of the example to measure the resistivities and the rates of the oxygen concentration variation. From these values, the piezoelectric devices were judged whether they were applicable to laminated piezoelectric actuators. Here, the rate of the oxygen concentration variation refers to the rate of the oxygen concentration of the piezoelectric plate 2 on the positive electrode side of the piezoelectric plate 2 with respect to the initial oxygen concentration thereof after the electric field was applied to them repeatedly $10^9$ times. The oxygen concentrations were measured in the same means as that of the example. Moreover, the resistivity refers to the length-wise resistivity of the electrode materials, which were printed by baking on the surfaces of the green sheets. The resistivity was measured by the so-called four-terminal method.

Table 1 sets forth the results of the measurements. When the addition of the $IrO_2$ was varied in a range of from 0 to 30% by weight respect to the sum of Ag and $IrO_2$ taken as 100% by weight, the resistivity of the electrodes was varied in a range of from $31 \times 10^{-6}$ to $55 \times 10^{-3}$ Ω.cm. When the resistivity is large, the operating voltage rises to be consumed as heat so that no highly accurate voltage-displacement characteristic can be obtained at all. Accordingly, such a piezoelectric device is not appropriate for a laminated piezoelectric actuator. Therefore, the piezoelectric devices were judged to be satisfactory when their resistivities were $10^{-3}$ Ω.cm or less. Moreover, when the rate of the oxygen concentration variation is too large, it is meaningless to improve it. Therefore, the piezoelectric devices were judged to be satisfactory when their rates of the oxygen concentration variation were 4% or less. Table 1 also sets forth the results of the judgements wherein the mark "○" designates being satisfactory and the mark "X" designates being unsatisfactory.

TABLE 1

| $IrO_2$ Addition (% by Weight) | Resistivity (Ω · cm) | Rate of Oxygen Concentration Variation (%) | Judgement |
|---|---|---|---|
| 0 | $31 \times 10^{-6}$ | 8.5 | X |
| 0.5 | $50 \times 10^{-6}$ | 4.1 | X |
| 1 | $58 \times 10^{-6}$ | 2.5 | ○ |
| 2 | $81 \times 10^{-6}$ | 2.1 | ○ |
| 4 | $93 \times 10^{-6}$ | 1.8 | ○ |
| 6 | $4 \times 10^{-5}$ | 1.5 | ○ |
| 8 | $14 \times 10^{-5}$ | 1.2 | ○ |
| 10 | $28 \times 10^{-5}$ | 1.2 | ○ |
| 12 | $16 \times 10^{-5}$ | 1.1 | ○ |
| 14 | $82 \times 10^{-5}$ | 1.0 | ○ |
| 20 | $47 \times 10^{-4}$ | 0.9 | ○ |
| 22 | $5 \times 10^{-3}$ | 0.8 | X |
| 25 | $11 \times 10^{-3}$ | 0.6 | X |
| 30 | $55 \times 10^{-3}$ | 0.6 | X |

From Table 1, it was understood that the addition of the $IrO_2$ to the electrode material, which was composed of Ag mainly, could be appropriate when it fell in a range of from 1 to 20% by weight with respect to the sum of Ag and $IrO_2$ taken as 100% by weight.

Experimental Example No. 2

In Experimental Example No. 2, $YBa_2Cu_3O_7$ having a $K_2NiF_4$ type crystal structure was used as the electrically conductive oxide.

First, piezoelectric devices were produced in which the $YBa_2Cu_3O_7$ was added to the electrode material, which was composed of Ag mainly, while the content of the $YBa_2Cu_3O_7$ was varied in a range of from 0 to 30% by weight with respect to the sum of Ag and $YBa_2Cu_3O_7$ taken as 100% by weight. The resulting piezoelectric devices had the same dimensions and shape as those of Experimental Example No. 1. Subsequently, the piezoelectric devices were subjected to the repetitive electric field applications under the same conditions as those of Experimental Example No. 1 to measure the resistivities and the rates of the oxygen concentration variation. Table 2 sets forth the results of the measurements. The judgement criteria whether the piezoelectric devices were satisfactory or not were identical with those of Experimental Example No. 1.

TABLE 2

| $YBa_2Cu_3O_7$ Addition (% by Weight) | Resistivity ($\Omega \cdot cm$) | Rate of Oxygen Concentration Variation (%) | Judgement |
| --- | --- | --- | --- |
| 0 | $31 \times 10^{-6}$ | 8.5 | X |
| 0.5 | $56 \times 10^{-6}$ | 4.5 | X |
| 1 | $84 \times 10^{-6}$ | 2.6 | ○ |
| 2 | $91 \times 10^{-6}$ | 2.3 | ○ |
| 4 | $23 \times 10^{-5}$ | 2.1 | ○ |
| 6 | $48 \times 10^{-5}$ | 1.9 | ○ |
| 8 | $79 \times 10^{-5}$ | 1.6 | ○ |
| 10 | $3 \times 10^{-4}$ | 1.5 | ○ |
| 12 | $16 \times 10^{-4}$ | 1.3 | ○ |
| 14 | $82 \times 10^{-4}$ | 1.2 | X |
| 20 | $97 \times 10^{-4}$ | 1.0 | X |
| 22 | $5 \times 10^{-3}$ | 0.9 | X |
| 25 | $45 \times 10^{-3}$ | 0.8 | X |
| 30 | $81 \times 10^{-3}$ | 0.7 | X |

In Experimental Example No. 2, it was understood that the addition of the $YBa_2Cu_3O_7$ to the electrode material, which was composed of Ag mainly, could be appropriate when it fell in a range of from 1 to 12% by weight with respect to the sum of Ag and $YBa_2Cu_3O_7$ taken as 100% by weight.

Having now fully described the present invention, it will be apparent to one of ordinary skill in the art that many changes and modifications can be made thereto without departing from the spirit or scope of the present invention as set forth herein including the appended claims.

What is claimed is:

1. A laminated piezoelectric actuator, comprising:
   piezoelectric plates; and
   inner electrode layers composed of an electrode material;
   the piezoelectric plates and the inner electrode layers laminated alternately; and
   the electrode material including a metallic component and an electrically conductive oxide.

2. The laminated piezoelectric actuator set forth in claim 1, wherein said electrode material contains the electrically conductive oxide in an amount of from 1 to 20% by weight with respect to the sum of the metallic component and the electrically conductive oxide taken as 100% by weight.

3. The laminated piezoelectric actuator set forth in claim 1, wherein said piezoelectric plates include $Pb(Zr, Ti)O_3$.

4. The laminated piezoelectric actuator set forth in claim 1, wherein the metallic component includes at least one member selected from the group consisting of Ag, Pd, Pt, Rh, Al, Ni and Cu.

5. The laminated piezoelectric actuator set forth in claim 1, wherein the electrically conductive oxide is at least one rutile type crystal structure oxide selected from the group consisting of $IrO_2$, $OsO_2$, $RhO_2$, $PtO_2$, $MoO_2$, $WO_2$, $LaO_2$ and $SnO_2$.

6. The laminated piezoelectric actuator set forth in claim 5, wherein said electrode material contains the rutile type crystal structure oxide in an amount of from 1 to 20% by weight with respect to the sum of the metallic component and the electrically conductive oxide taken as 100% by weight.

7. The laminated piezoelectric actuator set forth in claim 1, wherein the electrically conductive oxide is at least one perovskite type crystal structure oxide selected from the group consisting of $SnO_2$, $(R.E.)O_2$, $M_x(R.E.)O_3$, $SrCoO_3$, $La_{1-x}Sr_xCoO_3$, $SrIrO_3$ and $BaPb_{1-x}Bi_xO_3$ wherein "R.E." stands for rare-earth element and "M" is at least one element selected from the group consisting of Mg, Na, K, Al, Cu, Sr, Ti, Ni, Fe, Mn, V and Cr.

8. The laminated piezoelectric actuator set forth in claim 7, wherein said electrode material contains the perovskite type crystal structure oxide in an amount of from 1 to 20% by weight with respect to the sum of the metallic component and the electrically conductive oxide taken as 100% by weight.

9. The laminated piezoelectric actuator set forth in claim 1, wherein the electrically conductive oxide is at least one $K_2NiF_4$ type crystal structure oxide selected from the group consisting of $La_2NiO_4$, $LaCuO_4$ and $YB_2Cu_3O_7$.

10. The laminated piezoelectric actuator set forth in claim 9, wherein said electrode material contains the $K_2NiF_4$ type crystal structure oxide in an amount of from 1 to 20% by weight with respect to the sum of the metallic component and the electrically conductive oxide taken as 100% by weight.

11. The laminated piezoelectric actuator set forth in claim 1, wherein the electrically conductive oxide is at least one pyrochlore type crystal structure oxide selected from the group consisting of $Pb_2Ir_2O_{7-x}$, $Pb_2Ru_2O_{7-x}$, $Bi_2Ir_2O_7$ and $Lu_2Ir_2O_7$.

12. The laminated piezoelectric actuator set forth in claim 11, wherein said electrode material contains the pyrochlore type crystal structure oxide in an amount of from 1 to 20% by weight with respect to the sum of the metallic component and the electrically conductive oxide taken as 100% by weight.

* * * * *